United States Patent [19]

Tsai

[11] Patent Number: 5,981,353
[45] Date of Patent: Nov. 9, 1999

[54] METHOD OF FORMING A SHALLOW TRENCH ISOLATION REGION

[75] Inventor: Meng-Jin Tsai, Hsinchu Hsien, Taiwan

[73] Assignee: United Microelectronics Corporation, Taiwan

[21] Appl. No.: 08/798,154

[22] Filed: Feb. 10, 1997

[30] Foreign Application Priority Data

Nov. 19, 1996 [TW] Taiwan ................................. 85114218

[51] Int. Cl.⁶ ....................................................... H01L 21/76
[52] U.S. Cl. ............................................. 438/424; 438/437
[58] Field of Search ................................... 438/424, 437, 438/514, 517, 586, 637, 638, 640, 643, 647

[56] References Cited

U.S. PATENT DOCUMENTS

| | | | |
|---|---|---|---|
| 4,755,477 | 7/1988 | Chao | 438/448 |
| 4,876,217 | 10/1989 | Zdebel | 438/430 |
| 5,677,229 | 10/1997 | Morita et al. | 438/424 |
| 5,712,185 | 1/1998 | Tsai et al. | 438/424 |

OTHER PUBLICATIONS

Stanley Wolf Silicon Processing for the VLSI Era vol. 1 pp. 161–164, 1986.

*Primary Examiner*—Charles Bowers
*Assistant Examiner*—David S Blum
*Attorney, Agent, or Firm*—Rabin & Champagne, P.C.

[57] ABSTRACT

A method of making a shallow trench isolation region which has a reduced kink effect at a subthreshold voltage by forming a shallow trench isolation region, including providing a silicon substrate having a front surface and a backside surface. A first pad oxide layer is c formed over the front surface, and a second pad oxide layer is currently formed over the backside surface. A first silicon nitride layer is formed over the first pad oxide layer, and a second silicon nitride layer is concurrently formed over the second pad oxide layer. The first silicon nitride layer, first pad oxide layer, and the silicon substrate are patterned to form a trench. A side-wall oxide layer is formed within the trench, and a first oxide layer is concurrently formed on a surface of the second silicon nitride layer. A second oxide layer is formed over the first silicon nitride layer and fills the trench. The first oxide layer is removed, and a portion of the second oxide layer is removed. The first silicon nitride layer and the second silicon nitride layer are removed. The removal of the first oxide layer and the subsequent steps are performed in sequence.

13 Claims, 7 Drawing Sheets

METHOD OF FORMING A SHALLOW TRENCH ISOLATION REGION

BACKGROUND OF THE INVENTION

1. Field of Invention

This invention relates in general to a method of forming a shallow trench isolation (STI) region, and more particularly, to a method of effectively removing a silicon nitride layer from a backside of a wafer during the manufacturing process of a shallow trench isolation region.

2. Description of Related Art

In the conventional manufacturing process of hallow trench isolation regions, silicon nitride layers are deposited using low pressure chemical vapor deposition (LPCVD) methods. The silicon nitride layers are generally used as a photoresist layer, and as a polishing end point layer in chemical mechanical polishing (CMP) operations. However, the conventional process used to remove the silicon nitride layer from the backside of the wafer conflicts with the processing of shallow trench isolation regions, and can lead to semiconductors having poor electrical properties.

The use of low pressure chemical vapor deposition causes a layer of silicon nitride to be deposited on both the front and back surfaces of the wafer (wafer surface and wafer backside). The presence of a silicon nitride layer on the backside of the wafer can affect other subsequent manufacturing processes, for example, the stability of photolithographic and rapid thermal annealing (RTA) processes. Therefore, the silicon nitride layer on the backside of the wafer has to be removed prior to performing the subsequent processes. A conventional method used to remove the silicon nitride layer includes immersing the wafer in a hydrofluoric acid solution, which removes an oxide layer from the surface of the silicon nitride layer. This is followed by removing the silicon nitride layer using hot phosphoric acid. However, this process may result in the formation of grooves along an edge of a trench, which can lead to a "kink effect", which may increase the current leakage at a subthreshold voltage, thus affecting the electrical properties of the final transistor.

The presence of a silicon nitride layer on the backside of a wafer during the manufacturing of a shallow trench isolation region may adversely affect the characteristics of the transistor, due to the following reasons:

(1) the non-uniformity of the backside of the wafer may compromise the precision of the window opening formed using photolithographic processes;

(2) the possible stress created by the silicon nitriade layer on the silicon substrate while undergoing heat recycling (especially during the high temperature sealing process of the tetra-ethyl-orthosilicate (TEOS)) may increase the number of substrate defects; and (3) as a result of an uneven thickness of the residual silicon nitride layer on the backside of the wafer, the sensitivity to surface temperature generated during rapid thermal annealing processes will be affected; consequently, temperature control precision in the rapid thermal annealing process is similarly affected.

FIGS. 1a through 1e are cross-sectional views of a shallow trench isolation region during the conventional manufacturing process. Referring to FIG. 1a, a pad oxide layer 101 is formed on the front surface of wafer (silicon substrate) 100. Simultaneously, a pad oxide layer 101' is formed on a backside of the wafer. Using LPCVP methods, a silicon nitride layer 102 is deposited over the front surface of the wafer. A silicon nitride layer 102' is simultaneously formed over the backside of the wafer. Referring to FIG. 1b, using photolithographic and etching processes, the silicon nitride layer 102, pad oxide layer 101, and wafer 100 are sequentially etched to form a shallow trench 103.

As shown in FIG. 1c, a side-wall oxide layer 104 is then grown on a surface of wafer 100 within the shallow trench 103. Concurrently, a silicon oxide layer 105 is formed over the backside of silicon nitride layer 102'.

Referring to FIG. 1d, TEOS, formed by atmospheric pressure chemical vapor deposition methods, fills the shallow trench 103 to obtain a dielectric layer 106 comprised of an oxide material.

Next, a sealing operation is performed. Due to the heat generated and the oxygen used during the sealing operation, the silicon oxide layer 105 at the backside of wafer 100 thickens.

Next, and using the silicon nitride layer 102 as a polishing end point layer, chemical mechanical polishing is used to remove extra portions of the dielectric layer 106. As a result, the cross-section shown in FIG. 1e is obtained.

In a subsequent step, the backside silicon nitride layer 102' has to be removed. The conventional method uses hot phosphoric acid to remove the backside silicon nitride layer 102'. However, the oxide layer 105 has to first be removed by immersing the layer in a solution of hydrofluoric acid. This process disadvantageously causes a portion of the oxide material of the dielectric layer 106 to be removed as well. Grooves are thus formed near the edges of the trench region, which may lead to the occurrence of the kink effect.

Referring to FIG. 2, an NMOS transistor having a gate oxide layer thickness of 60 Å, a drain voltage of 0.1 V, a channel width of 10 mm, a channel length of 0.25 mm, and a substrate voltage between about 0 and −4 V was provided and tested to determine the relationship between the drain current and the gate voltage when the kink effect was present. The relationship between the drain current and the gate voltage in the absence of such a kink effect is shown in FIG. 3. FIG. 2 shows that as a result of the subthreshold voltage distortion, a kink in the relationship graph is formed. This is the so-called kink effect.

SUMMARY OF THE INVENTION

It is therefore an object of this invention to provide a method of making a shallow trench isolation region which has a reduced kink effect at a subthreshold voltage by forming a shallow trench isolation region, including providing a silicon substrate having a front surface and a backside surface. A first pad oxide layer is formed over the front surface, and a second pad oxide layer is currently formed over the backside surface. A first silicon nitride layer is formed over the first pad oxide layer, and a second silicon nitride layer is concurrently formed over the second pad oxide layer. The first silicon nitride layer, first pad oxide layer, and the silicon substrate are patterned to form a trench. A side-wall oxide layer is formed within the trench, and a first oxide layer is concurrently formed on a surface of the second silicon nitride layer. A second oxide layer is formed over the first silicon nitride layer and fills the trench. The first oxide layer is removed, and a portion of the second oxide layer is removed. The first silicon nitride layer and the second silicon nitride layer are removed. The removal of the first oxide layer and the subsequent steps are performed in sequence.

Alternatively, the present invention proposes to form a shallow trench isolation region, by providing a silicon substrate having a front surface and a backside surface. A first pad oxide layer is formed over the front surface, and a second pad oxide layer is concurrently formed over the backside surface. A first silicon nitride layer is formed over the first pad oxide layer, and a second silicon nitride layer is concurrently formed over the second pad oxide layer. The first silicon nitride layer, first pad oxide layer and the silicon substrate are patterned to form a trench. A side-wall oxide layer is formed within the trench, and a first oxide layer is formed over the backside surface. A second oxide layer is formed over the first silicon nitride lay(r and fills the trench. The first oxide layer is removed, and the second silicon nitride layer is removed. A portion of the second oxide layer is removed, and the first silicon nitride layer is removed. The removing the first oxide layer and the, subsequent steps are performed in sequence.

The present invention also proposes a method of forming a shallow trench isolation region, that includes providing a silicon substrate having a front surface and a backside surface. A first pad oxide layer is formed over the front surface, and a second pad oxide layer is concurrently formed over the backside surface. A silicon nitride layer is formed on a surface of the first pad oxide layer. The silicon nitride layer, first pad oxide layer and the silicon substrate are patterned to form a trench. A side-wall oxide layer is formed within the trench. An oxide layer is formed over the silicon nitride layer and fills the trench. A sealing operation is performed. A portion of the oxide layer is removed. The silicon nitride layer is removed.

The present invention further proposes a method of forming a shallow trench isolation region, including providing a silicon substrate having a front surface and a backside surface. A first pad oxide layer is formed over the front surface, and a second pad oxide layer is concurrently formed over the backside surface. A thin film layer is formed on a surface of the first pad oxide layer. The thin film layer, the first pad oxide layer, and the silicon substrate are patterned to form a trench. A side-wall oxide layer is formed within the trench. An oxide layer is formed over the thin film layer and fills the trench. A portion of the oxide layer is removed, and the thin film layer is removed.

As a result of the present invention, the removal of the silicon nitride layer from the back of the wafer is facilitated, the window openings are more precisely formed in the photolithographic processes, substrate defects are reduced, and the temperature control in the rapid thermal annealing processes is improved, so as to obtain a transistor with superior electrical properties.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DETAILED DESCRIPTION OF THE PREFERRED EMBODIMENTS

Figure 4A:
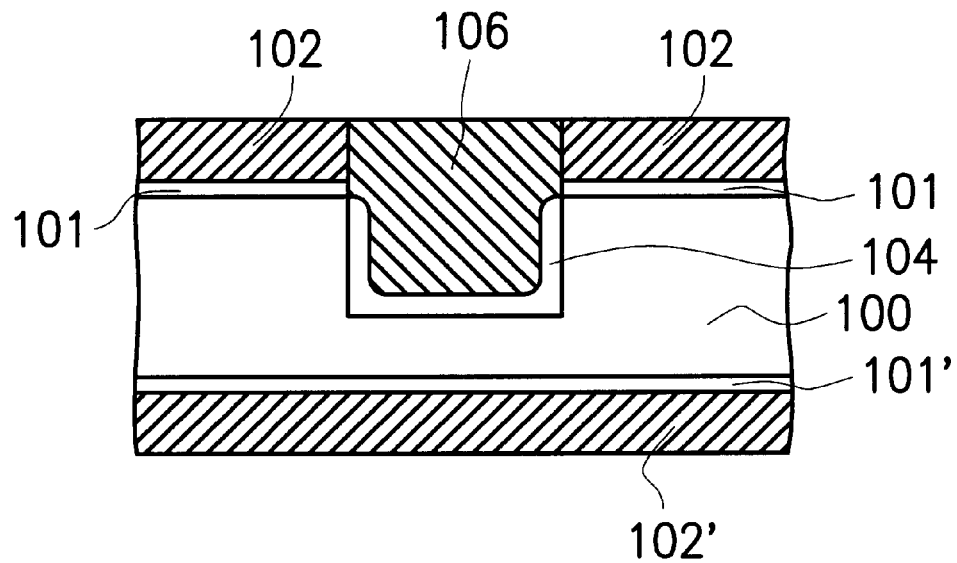
FIGS. 4a and 4b are cross-sectional views of a shallow trench isolation region according to a first preferred embodiment of this invention.
Figure 4B:
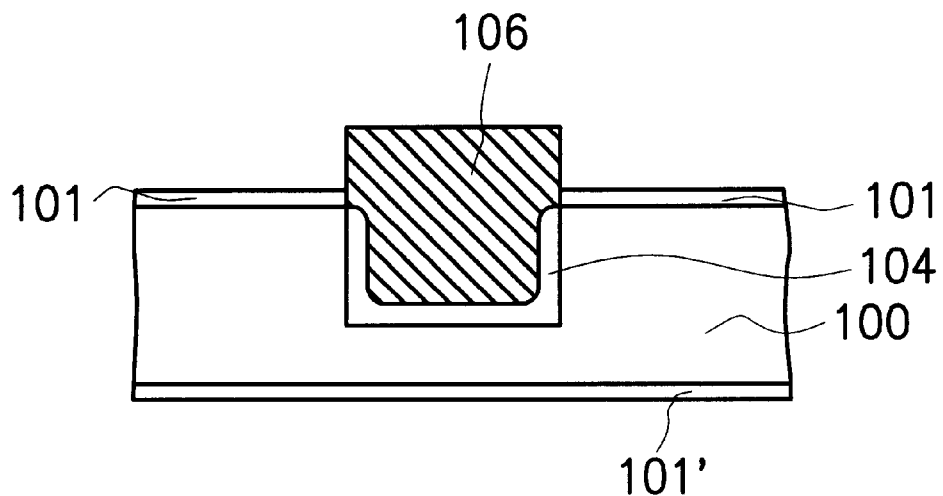

FIGS. 4a and 4b show the method of making a shallow trench isolation region according to a first embodiment of the present invention. In this embodiment, since most of the techniques used in the initial stages of the manufacturing of the shallow trench isolation region are similar to the conventional techniques, for example, the resulting structure shown in FIGS 1a through 1d, a detailed description of these initial stages is omitted. Instead, and using the structure shown in FIG. 1d as a base, only the subsequent manufacturing processes are described. Also, to simplify the explanation, elements in this embodiment that are identical to those shown in FIG. 1d are labeled with the same numerals.

Figure 1A:
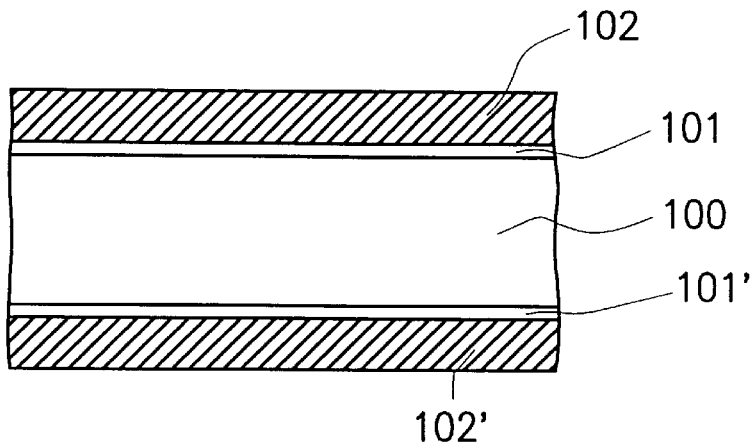
FIGS. 1a through 1e are cross-sectional views of a shallow trench isolation region showing a conventional method of removing the silicon nitride from the backside of a wafer.
Figure 1B:
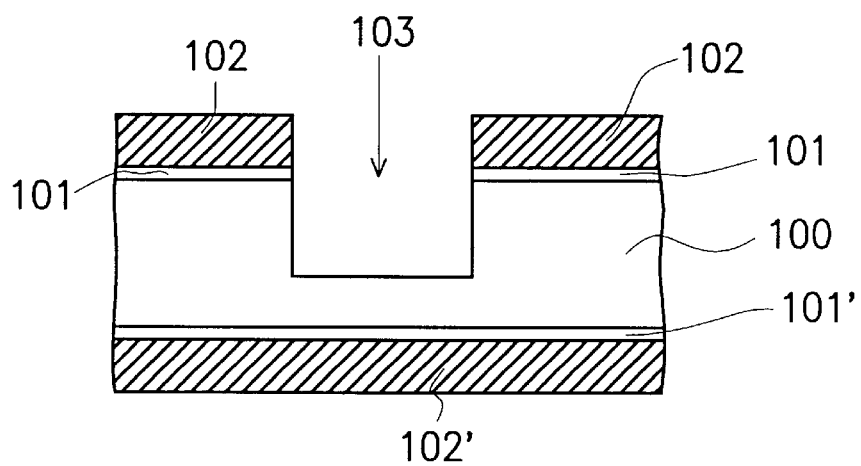
Figure 1C:
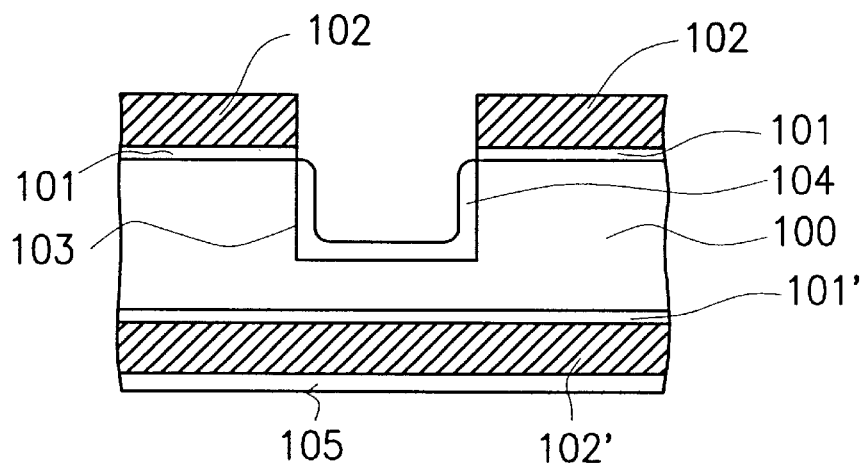
Figure 1D:
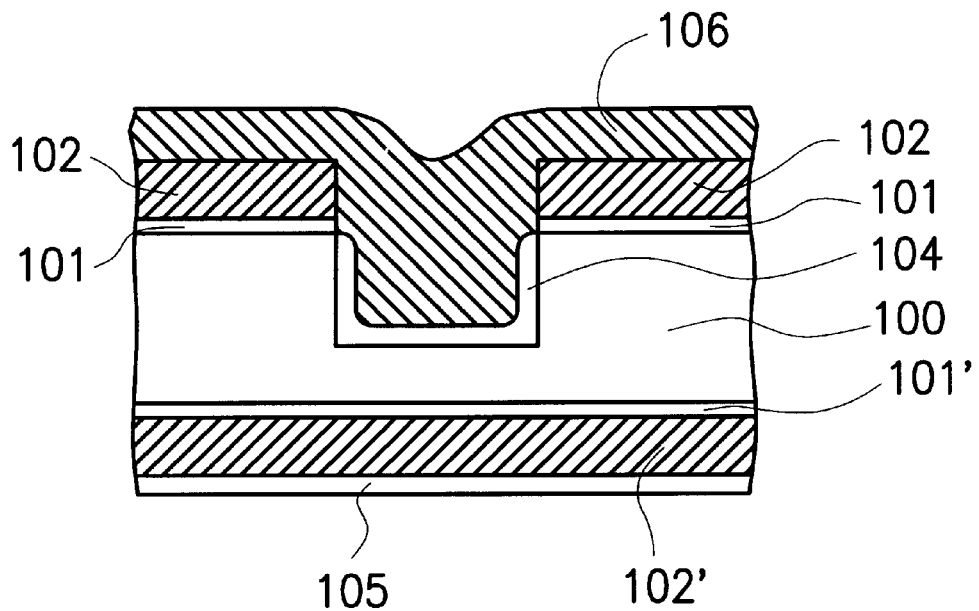
Figure 1E:
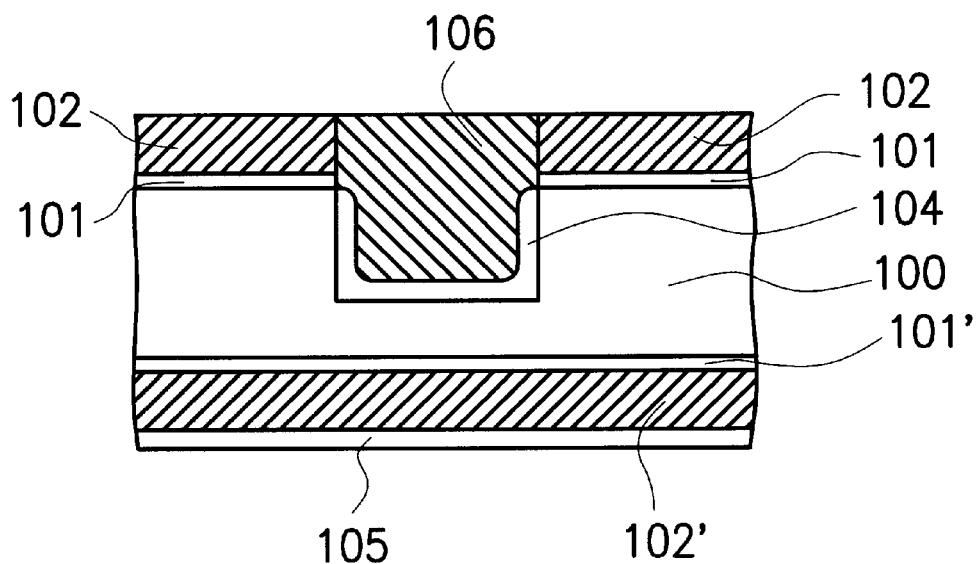
Figure 2:
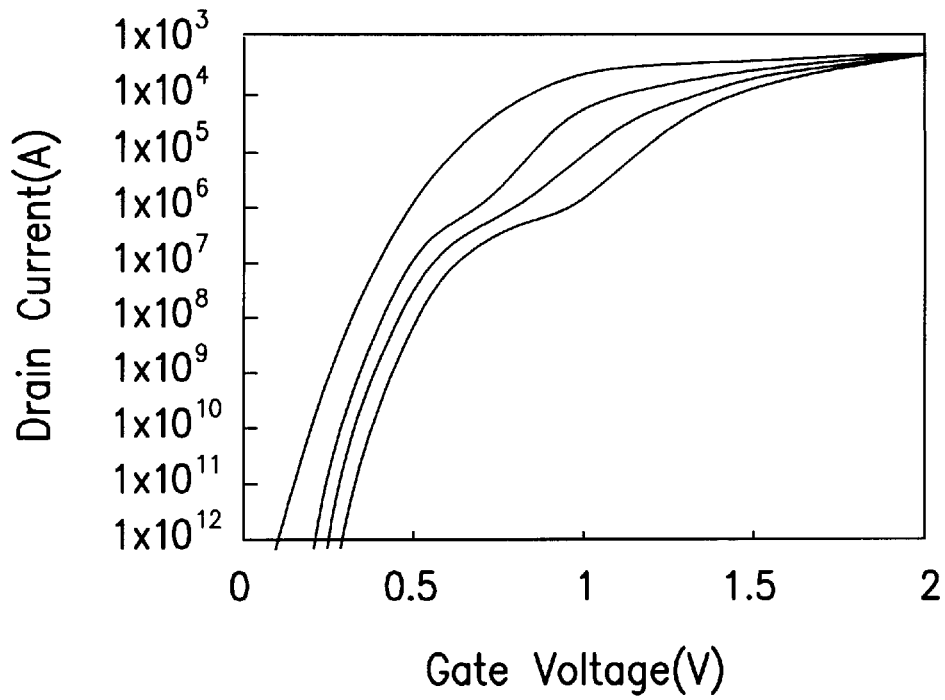
FIG. 2 is a graph showing the relationship between the gate voltage and the drain current of an NMOS in the presence of the kink effect.
Figure 3:
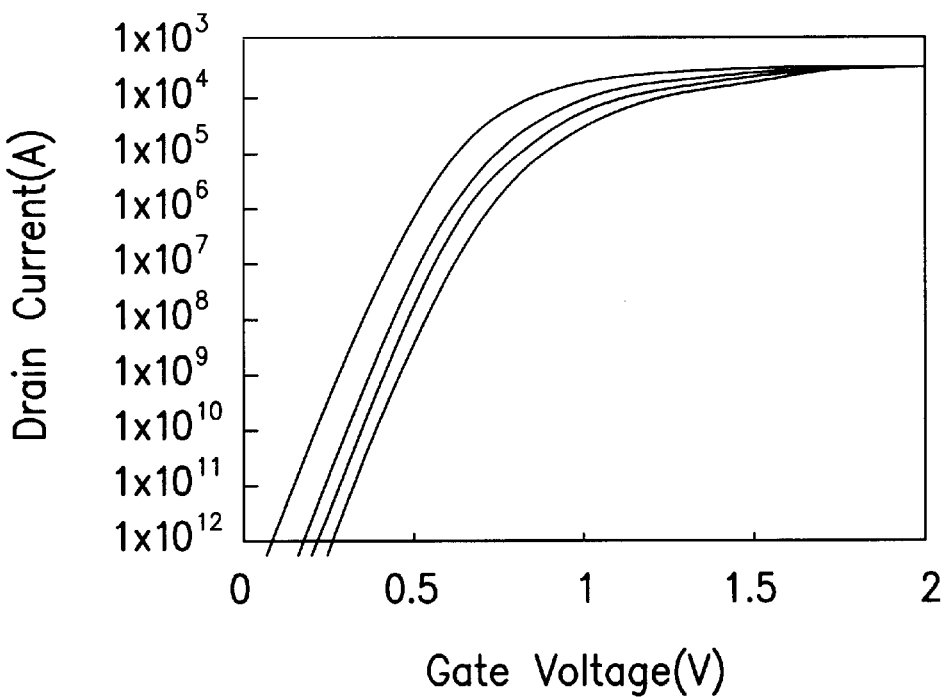
FIG. 3 is a graph showing the relationship between the gate voltage and the drain current of an NMOS in the absence of the kink effect.

Based on the wafer structure shown in FIG. 1d, after the formation of a dielectric layer 106, a sealing operation is performed, followed by the immersion of the wafer in a hydrofluoric acid solution to remove the silicon oxide layer 105. Next, and using the silicon nitride layer 102 as a polishing end point, a portion of the dielectric layer 106 is removed using, for example, a chemical mechanical polishing operation, to obtain the cross-section shown in FIG. 4a. Thereafter, hot phosphoric acid is used to simultaneously remove both the silicon nitride layer 102 and backside the silicon nitride layer 102'. As a result, the shallow trench isolation region having the cross-section shown in FIG. 4b is obtained.

Figure 5A:
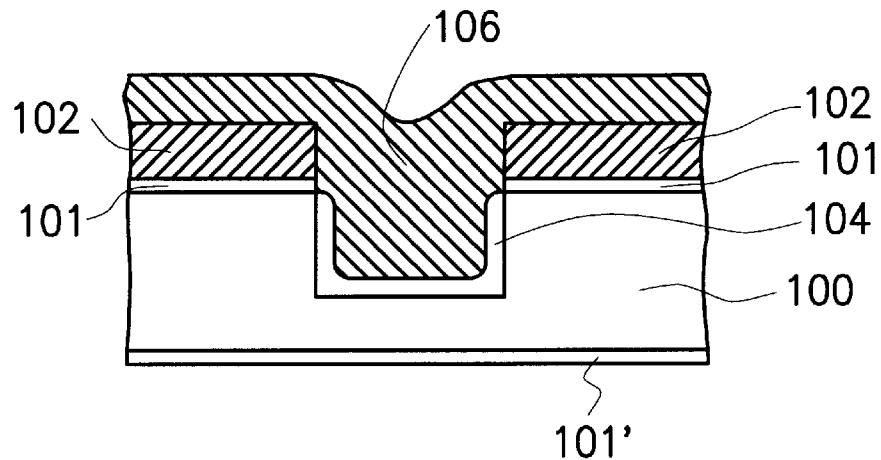
FIGS. 5a through 5c are cross-sectional views of a shallow trench isolation region according to a second preferred embodiment of this invention.
Figure 5B:
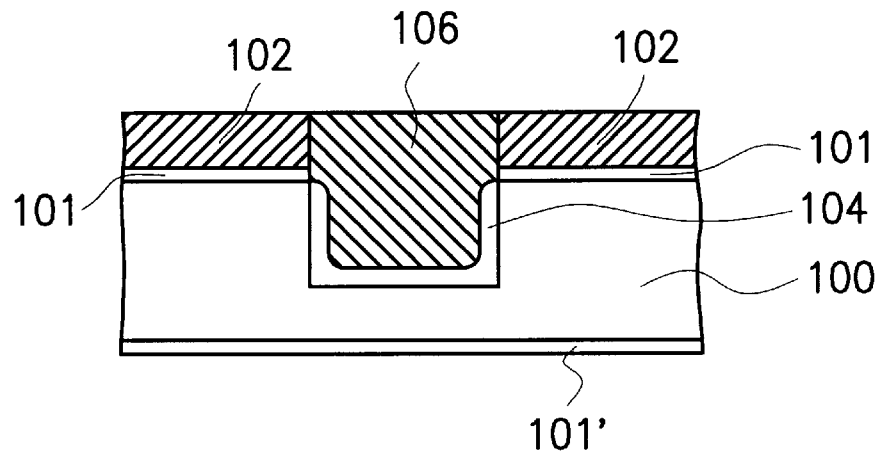
Figure 5C:
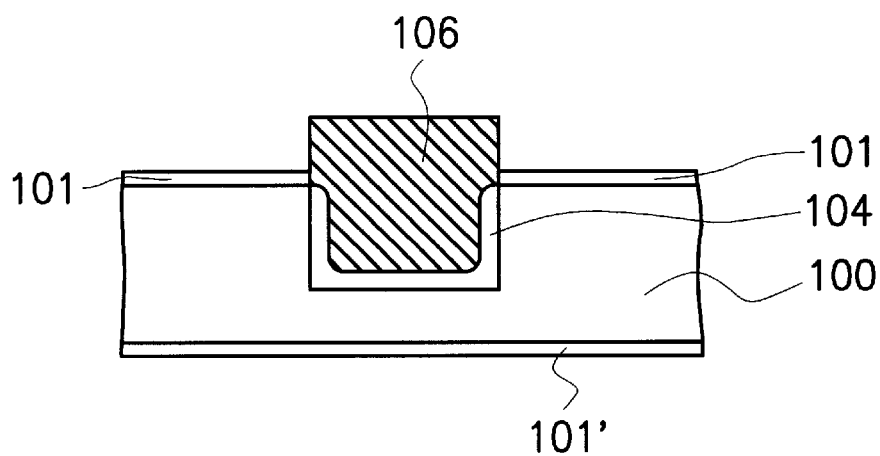

FIGS. 5a through 5c show the method of making a shallow trench isolation region according to a second embodiment of the present invention. Based on the known resultant wafer structure shown in FIG. 1d, after the formation of a dielectric layer 106 by the filling of dielectric material, the sealing process is deferred. Instead, the wafer is immersed in hydrofluoric acid solution to etch away the silicon oxide layer 105. Then, hot phosphoric acid is used to etch away the silicon nitride layer 102' and then the sealing operation is performed. Using this arrangement, the number of defects in the wafer 100 is reduced, and a cross-section as shown in FIG. 5a is obtained.

Next, and using the silicon nitride layer 102 as a polishing end point, a portion of the dielectric layer 106 is removed using, for example, chemical mechanical polishing, to obtain the cross-section shown in FIG. 5b. Lastly, hot phosphoric acid is used to remove the silicon nitride layer 102 to obtain the cross-section shown in FIG. 5c.

Figure 6A:
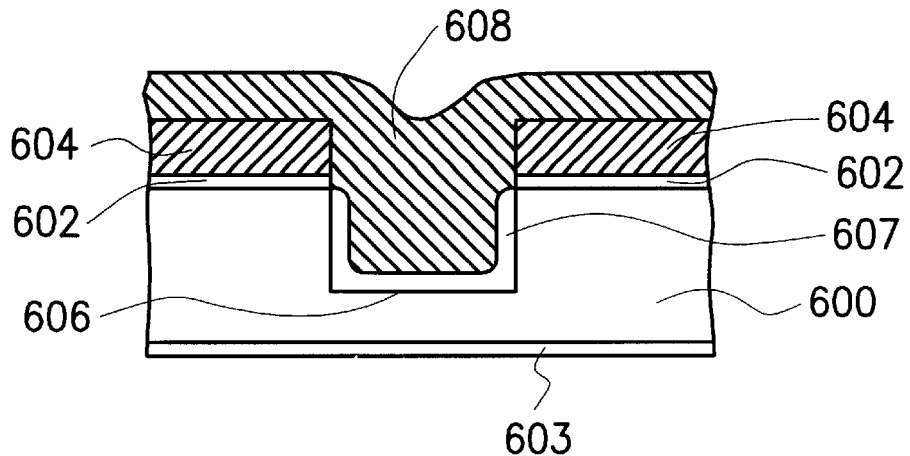
FIGS. 6a through 6c are cross-sectional views of a shallow trench isolation region according to a third preferred embodiment of this invention.
Figure 6B:
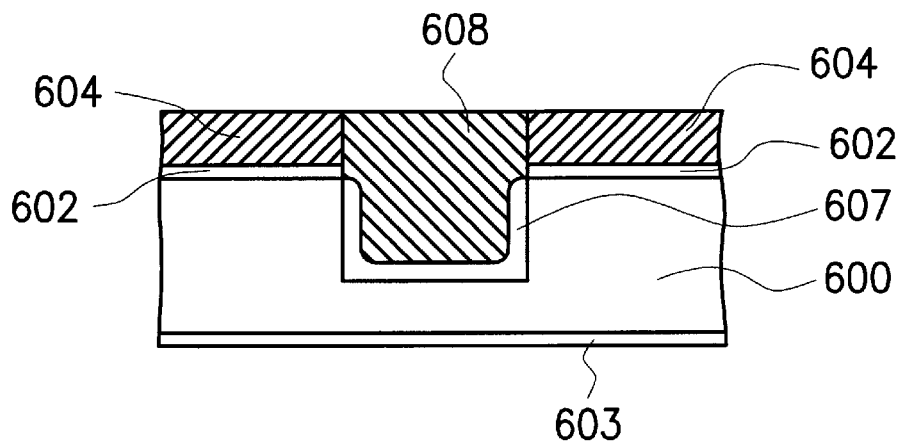
Figure 6C:
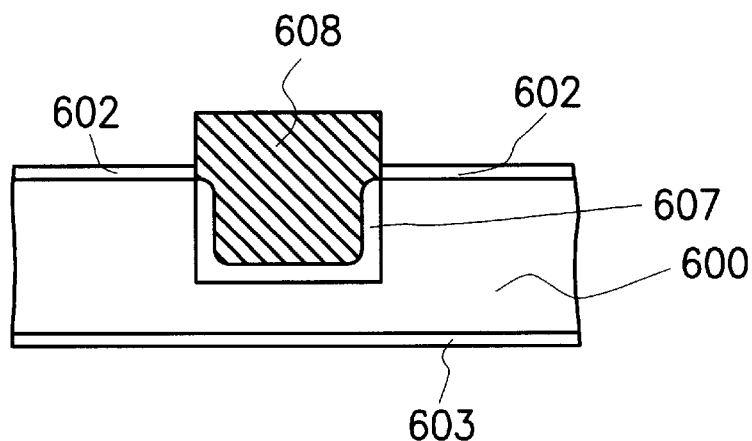

FIGS. 6a through 6c show a method of making a shallow trench isolation region according to a third embodiment of the present invention. Referring to FIG. 6a, pad oxide layers 602 and 603 are formed on the front surface and on the backside of the wafer (silicon substrate) 600, respectively, using, for example, thermal oxidation. Then, a silicon nitride layer 604 is formed over the wafer 600 using, for example, plasma enhanced chemical vapor deposition (PECVD) or atmospheric pressure chemical vapor deposition (APCVD). Since the silicon nitride layer 604 is only formed on the front of the wafer surface using the two methods mentioned above, the inherent problems caused by the formation of a silicon nitride layer on the backside of the wafer are avoided. Thereafter, using conventional photolithographic and etching processes, the silicon nitride layer 604, the pad oxide layer 602 and the wafer 600 are etched in sequence to form a shallow trench 606. Next, a side-wall oxide layer 607 is formed on the surface of wafer 600 within the shallow trench 606 using, for example, thermal oxidation. Then, chemical vapor deposition is performed to fill the trench with a dielectric material. This is followed by a sealing operation, thus forming a dielectric layer 608. In a subsequent step, excess material from the dielectric layer 608 is removed using, for example, chemical mechanical polishing, using the silicon nitride layer 604 as a polishing end point. Thus, the cross-section shown in FIG. 6b is obtained. Lastly, the silicon nitride layer 604 is removed using, for example, wet etching to obtain the cross-section shown in FIG. 6c.

Figure 7A:
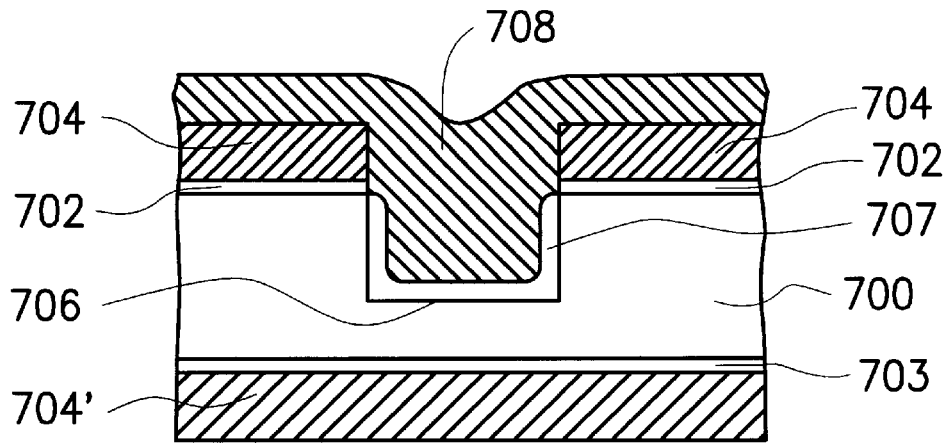
FIGS. 7a through 7c are cross-sectional views of a shallow trench isolation region according to a fourth preferred embodiment of this invention.
Figure 7B:
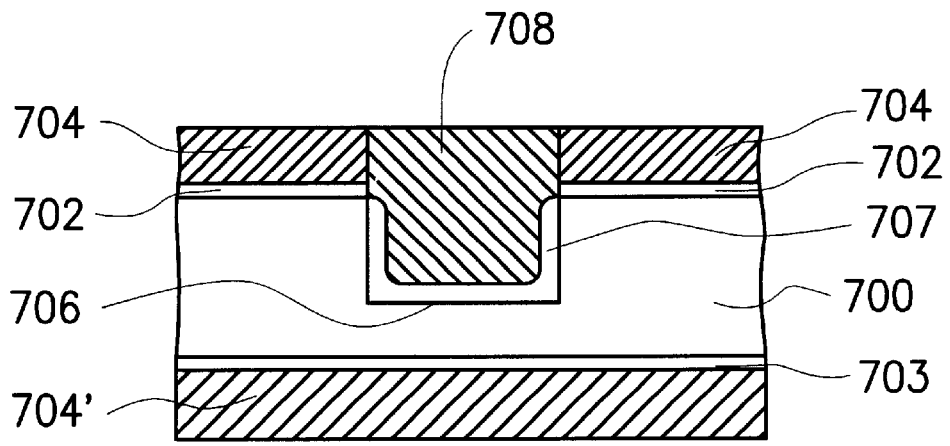
Figure 7C:
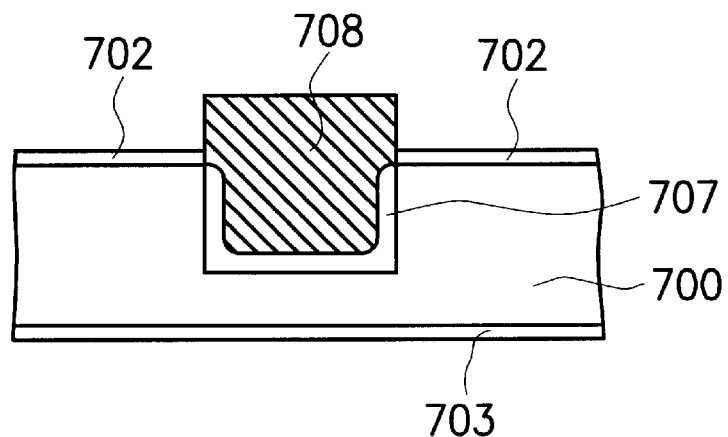

FIGS. 7a through 7c show another embodiment of a method of making a shallow trench isolation region according to the present invention. First, and referring to FIG. 7a, pad oxide layers 702 and 703 are formed on the front surface and on the backside of a wafer (silicon substrate) 700, respectively using, for example, thermal oxidation. Then, polysilicon or amorphous silicon layers 704 and 704' are formed on the front surface and the backside of the wafer 700, respectively, to cover the wafer. Since the silicon layers 704, 704' are comprised of silicon, no adverse stress is generated during the sealing operation. In contrast, a silicon nitride layer on silicon will generate much stress during sealing operations due to the difference in materials, which may result in many substrate defects.

In a subsequent step, conventional photolithographic and etching processes are used to etch, in sequence, the silicon layer 704, pad oxide layer 702, and the wafer 700 thus forming a shallow trench 706. Thereafter, a side-wall oxide layer 707 is formed over the surface of the wafer within shallow trench 706 using, for example, thermal oxidation. Next, chemical vapor deposition is used to fill the trench 706 with a dielectric material, which is followed by a sealing operation, to form a dielectric layer 708. Excess material from the dielectric layer 708 is removed using, for example, chemical mechanical polishing, with the silicon layer 704 serving as a polishing end point. Thus, the cross-section shown in FIG. 7b is obtained. Lastly, the silicon layers 704 and 704' are removed using, for example, wet etching or dry etching, to obtain the cross-section shown in FIG. 7c.

In this embodiment, if the polysilicon or amorphous silicon layer 704 is formed using either plasma enhanced chemical vapor deposition or atmospheric pressure chemical vapor deposition, then no polysilicon or amorphous silicon layer 704' will be deposited on the backside of the wafer.

One advantageous feature of this invention is that after performing the sealing operation of the refilled dielectric, the oxide layer on the backside of the wafer is immediately etched away by immersing the wafer in a hydrofluoric acid solution. Then, a chemical mechanical polishing operation is performed to remove any excess dielectric material. Finally, hot phosphoric acid is used to remove the silicon nitride layer from the backside of the wafer, to complete the manufacturing process of the shallow trench isolation region.

A further advantageous feature of this invention is that after the dielectric refilling, the oxide layer and the silicon nitride layer on the backside of the wafer are sequentially removed using etching, while concurrently, the silicon nitride layer on the front surface of the wafer is protected by the refilled dielectric. Further, the removal of the silicon nitride layer from the backside of the wafer before performing the sealing operation has the advantage of reducing substrate defects caused by stresses generated from the high temperature sealing operation.

Another advantageous feature of this invention is the use of plasma enhanced chemical vapor deposition or atmospheric pressure chemical vapor deposition to form a silicon nitride layer on the silicon substrate surface, instead of the conventional low pressure chemical vapor deposition. This eliminates the step of removing the silicon nitride layer from the backside of the wafer.

Yet a further advantageous feature of this invention is the formation of a polysilicon or amorphous silicon layer on the surface of the silicon substrate, instead of forming a silicon nitride layer using conventional low pressure chemical deposition. This may prevent problems such as substrate defects, caused by the presence of a silicon nitride layer on the backside of the wafer.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of forming a shallow trench isolation region, comprising:
   (a) providing a silicon substrate having a front surface and a backside surface;
   (b) concurrently forming a first pad oxide layer over the front surface, and a second pad oxide layer over the backside surface;
   (c) concurrently forming a first silicon nitride layer over the first pad oxide layer, and a second silicon nitride layer over the second pad oxide layer;
   (d) patterning the first silicon nitride layer, first pad oxide layer, and the silicon substrate to form a trench;
   (e) concurrently forming a side-wall oxide layer within the trench, and a first oxide layer on a surface of the second silicon nitride layer;
   (f) forming a second oxide layer over the first silicon nitride layer and filling the trench;
   (g) removing the first oxide layer;
   (h) removing a portion of the second oxide layer; and
   (i) removing the first silicon nitride layer and the second silicon nitride layer, wherein (g) through (i) are performed in sequence.

2. A manufacturing method according to claim 1, wherein forming a second oxide layer comprises using chemical vapor deposition.

3. A manufacturing method according to claim 1, further comprising, after (f) and before (g), performing a sealing operation.

4. A manufacturing method according to claim 1, wherein the removing the first oxide layer comprises performing wet etching.

5. A manufacturing method according to claim 1, wherein the removing a portion of the second oxide layer comprises performing chemical mechanical polishing.

6. A manufacturing method according to claim 1, wherein the removing the first silicon nitride layer and the second silicon nitride layer comprises performing wet etching.

7. A method of forming a shallow trench isolation region, comprising:

(a) providing a silicon substrate having a front surface and a backside surface;

(b) concurrently forming a first pad oxide layer over the front surface, and a second pad oxide layer over the backside surface;

(c) concurrently forming a first silicon nitride layer over the first pad oxide layer, and a second silicon nitride layer over the second pad oxide layer;

(d) patterning the first silicon nitride layer, first pad oxide layer and the silicon substrate to form a trench;

(e) concurrently forming a side-wall oxide layer within the trench, and a first oxide layer over the backside surface;

(f) forming a second oxide layer over the first silicon nitride layer and filling the trench;

(g) removing the first oxide layer;

(h) removing the second silicon nitride layer;

(i) removing a portion of the second oxide layer; and (j) removing the first silicon nitride layer, wherein (g) through (I) are performed in sequence.

8. A manufacturing method according to claim 7, wherein the forming a second oxide layer comprises using chemical vapor deposition.

9. A manufacturing method according to claim 7, wherein the removing the first oxide layer comprises performing an etching process.

10. A manufacturing method according to claim 7, wherein the removing the second silicon nitride layer comprises performing an etching process.

11. A manufacturing method according to claim 7, further comprising, after (h) and before (i), performing a sealing operation.

12. A manufacturing method according to claim 7, wherein the removing a portion of the second oxide layer comprises performing chemical mechanical polishing.

13. A manufacturing method according to claim 7, wherein the removing the first silicon nitride layer comprises performing wet etching.

* * * * *